US006708501B1

United States Patent
Ghoshal et al.

(10) Patent No.: US 6,708,501 B1
(45) Date of Patent: Mar. 23, 2004

(54) COOLING OF ELECTRONICS BY ELECTRICALLY CONDUCTING FLUIDS

(75) Inventors: Uttam Ghoshal, Austin, TX (US); Andrew Carl Miner, Austin, TX (US)

(73) Assignee: Nanocoolers, Inc., Austin, TX (US)

( * ) Notice: Subject to any disclaimer, the term of this patent is extended or adjusted under 35 U.S.C. 154(b) by 0 days.

(21) Appl. No.: 10/313,696

(22) Filed: Dec. 6, 2002

(51) Int. Cl.$^7$ ................................. F25B 21/02
(52) U.S. Cl. .................. 62/3.7; 62/259.2; 165/104.19
(58) Field of Search ................ 62/3.2, 3.3, 3.7, 62/259.2, 434; 165/104.19

(56) References Cited

U.S. PATENT DOCUMENTS 5,184,211 A * 2/1993 Fox ........................... 257/706
5,943,211 A * 8/1999 Havey et al. ............... 361/699
6,021,844 A * 2/2000 Batchelder ................. 165/80.3
6,175,495 B1 * 1/2001 Batchelder ................. 361/695

* cited by examiner

Primary Examiner—Melvin Jones
(74) Attorney, Agent, or Firm—William L. Botjer

(57) ABSTRACT

A system to provide effective removal of heat from a high power density device. The system has a heat spreader and a heat sink structure. The heat spreader is divided into one or more chambers. Electromagnetic pumps are placed inside each chamber in a configuration that facilitates easy circulation of liquid metal inside the chamber. The liquid metal preferably is an alloy of gallium and indium that has high electrical conductivity and high thermal conductivity. The liquid metal carries heat from a localized area (over the high power density device) and distributes it over the entire spreader. This results in a uniform distribution of heat on the base of the heat sink structure and hence effective removal of heat by the heat sink structure.

15 Claims, 10 Drawing Sheets

COOLING OF ELECTRONICS BY ELECTRICALLY CONDUCTING FLUIDS

BACKGROUND

The present invention relates to a system for dissipating heat from a high power density device (HPDD). More specifically, the present invention relates to a heat spreader that helps in effective dissipation of heat from the HPDD.

Electronic devices such as central processing units, graphic-processing units, laser diodes etc. generate a lot of heat during operation. In case the generated heat is not dissipated properly from high power density devices, this may lead to temperature buildup in these devices. The buildup of temperature can adversely affect the performance of these devices. For example, excessive temperature buildup may lead to malfunctioning or breakdown of the devices. So, it is important to remove the generated heat in order to maintain normal operating temperatures of these devices.

The heat generated by HPDD is removed by transferring the heat to the ambient atmosphere. As heat generated by HPDD increases, more heat has to be transferred to maintain the operating temperature of the HPDD. The transfer of heat from a HPDD to the atmosphere faces thermal resistance. In order to transfer more heat, this thermal resistance has to be reduced. One way to reduce thermal resistance is to increase the effective surface area of the hot device, for this purpose a finned heat sink structure is sometimes used. This finned heat sink structure increases the effective surface area for transfer of heat from the HPDD, thereby reducing the thermal resistance between a HPDD and atmosphere.

FIG. 1 shows a typical finned heat sink structure 101 mounted on HPDD 103. The HPDD is mounted on mounting board 105. Heat generated by HPDD 103 is transferred to finned heat sink structure 101. This finned heat sink structure in turn dissipates the heat to the atmosphere. The surface area of the finned heat sink structure is much larger than that of the HPDD. This increases the effective surface area for transfer of heat from the HPDD leading to reduced thermal resistance between the HPDD and the atmosphere. The reduced thermal resistance results in an increase in the rate of dissipation of heat to the atmosphere. Heat is transferred from the finned heat sink structure 101 to the atmosphere by natural convection, or by forced convection with the use of a fan.

However, the material used to construct finned heat sink structures has inherent resistance to the flow of heat. This leads to uneven distribution of temperature at base of the finned heat sink structure. This reduces the effectiveness of the finned heat sink structure in dissipating the heat.

FIG. 2A shows a finned heat sink structure 201 with uneven temperature distribution at the base of the structure. Arrows of differing lengths show the flow of heat in the finned heat sink structure. The shorter lengths of arrows at the outer fins depict less flow of heat as compared to the flow of heat in the inner fins (depicted by large arrows). The outer fins of finned heat sink structure 201 are not as effective in dissipating heat as the inner fins. This is due to an uneven temperature distribution at the base. FIG. 2B shows a finned heat sink structure 205 with uniform temperature at the base of the structure. The same lengths of arrows at the outer and inner fins depict uniform flow of heat in the fins. Thus, unlike finned heat sink structure 201 of FIG. 2A, the outer fins of finned heat sink structure 205 are as effective in dissipating heat, as its inner fins.

Hence, in order to increase the effectiveness of the finned heat sink structure heat needs to be uniformly distributed at the base of the structure. An important way for uniformly distributing heat at the base of the finned heat sink structure is by using a device called a heat spreader. The heat spreader is placed between HPDD and finned heat sink structure and spreads heat uniformly at the base of the structure.

FIG. 3 depicts the use of heat spreaders for uniform distribution of heat. FIG. 3A shows a HPDD 301 on a mounting board 303. A Finned heat sink structure 305 is placed in contact with HPDD 301. Heat is removed by conduction from HPDD 301 to finned heat sink structure 305. Heat is thereafter dissipated by finned heat sink structure 305 to the ambient atmosphere.

FIG. 3B shows a heat spreader 307 placed between HPDD 301 and finned heat sink structure 305. Heat spreader 307 increases transfer of heat between HPDD 301 and finned heat sink structure 305 by evenly distributing heat at the base of finned sink structure 305.

Heat spreaders are usually made of materials with low thermal resistance. Examples of such materials include copper or aluminum. Lightweight materials having high thermal conductivity such as graphite sheets and CVD (chemical vapor deposition) diamond thin film are also used for making heat spreaders. Typically, these high thermal conducting materials are costly and do not increase performance of the heat spreader substantially more than aluminum or copper heat spreaders.

Head spreaders may also be based on vapor chambers. A vapor chamber based heat spreader involves the vaporization and condensation of the liquid filling it. This heat spreader has a vacuum vessel with a saturated wick structure lining the inside walls. As heat is applied to the base of the heat spreader, the working fluid at the base immediately vaporizes, and the vapor rushes to fill the vacuum. Wherever the vapor comes into contact with cooler wall surface it condenses, releasing its latent heat of vaporization. The condensed liquid returns to the base via capillary action in the wick structure.

FIG. 4 shows a heat spreader 401 based on a vapor chamber. Heat spreader 401 is placed between HPDD 403 and finned heat sink structure 405. Heat spreader 401 has two surfaces, a surface 407 in contact with the finned heat sink structure 405 and a surface 409 in contact with HPDD 403. There is a lining 411 inside the heat spreader. Liquid on surface 409 absorbs heat from HPDD 403, evaporates and fills the vacuum in heat spreader 401. When it comes in contact with surface 407, it transfers heat to finned heat sink structure 405, condenses and moves back to surface 409 due to gravity or the capillary effect. The capillary action enables the performance of vapor chamber based heat spreader to be less dependent on the device's orientation with respect to gravity Also, thermal resistance associated with the vapor spreading is negligible.

However, maximum heat transfer in a vapor chamber based heat spreader is limited by vapor/liquid nucleation properties. Heat transfer is also limited by the presence of interface resistances such as that between metal surface and liquid layer and between metal surface and vapor.

From the above discussion, it is evident that presently available heat spreaders suffer from various limitations that limit the effectiveness of these heat spreaders. These limitations lead to higher device operating temperatures and decreased performance of HPDD. Thus, there is a need for heat spreaders that can effectively remove the heat from high power density devices.

SUMMARY

It is an object of the invention to provide a system for effective removal of heat from high power density devices.

It is another object of the invention to provide a heat spreader that uses electromagnetic pumps for circulating liquid metal inside the heat spreader for uniform distribution of heat throughout the heat spreader.

It is another object of the invention to provide a heat spreader that uses liquid metals like gallium indium alloy, bismuth, indium, gallium, mercury and sodium potassium eutectic alloy to provide uniform distribution of heat throughout the heat spreader.

It is yet another object of the invention to provide heat spreaders of different shapes and sizes depending on form factor limitations.

It is yet another object of the invention to provide heat spreaders that employ thermoelectric generators to power the electromagnetic pumps thereby doing away with the need of external power sources.

It is further object of the invention to provide electromagnetic pumps that use polymers or refractory metals as the tube material and gallium indium alloy as the liquid metal.

The invention provides a system for the effective removal of heat from a high power density device. The system in accordance with the invention has a heat sink structure mounted on a heat spreader. The heat spreader has electromagnetic pumps for circulating liquid metal throughout the heat spreader. Circulation of liquid metal throughout the spreader allows for uniform distribution of heat in the spreader and at the base of the heat sink structure. This uniform distribution increases the transfer of heat from the high power density device to the heat sink structure and consequently from the heat sink structure to the atmosphere.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF THE PREFERRED EMBODIMENTS

Figure 1:
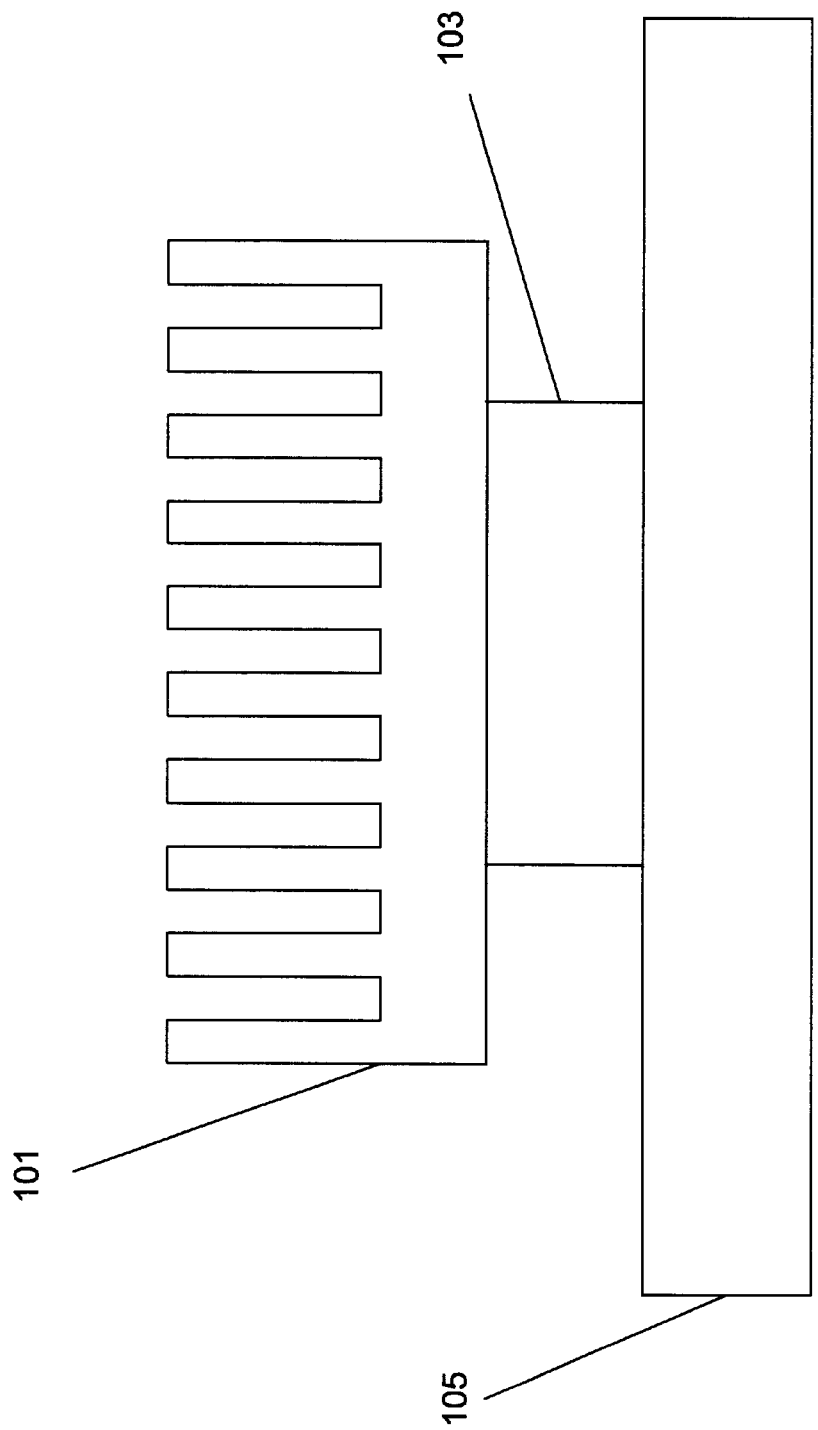
FIG. 1 shows a finned heat sink structure mounted on a High Power Density Device (HPDD)
Figure 2A:
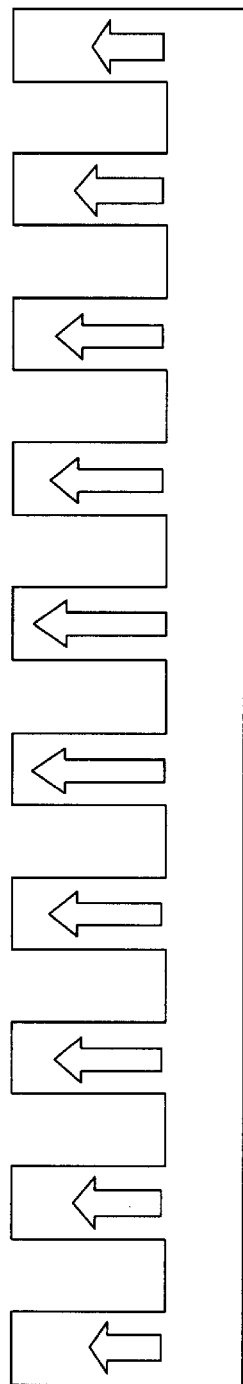
FIG. 2A shows a finned heat sink structure with uneven temperature distribution at the base of the structure.
Figure 2B:
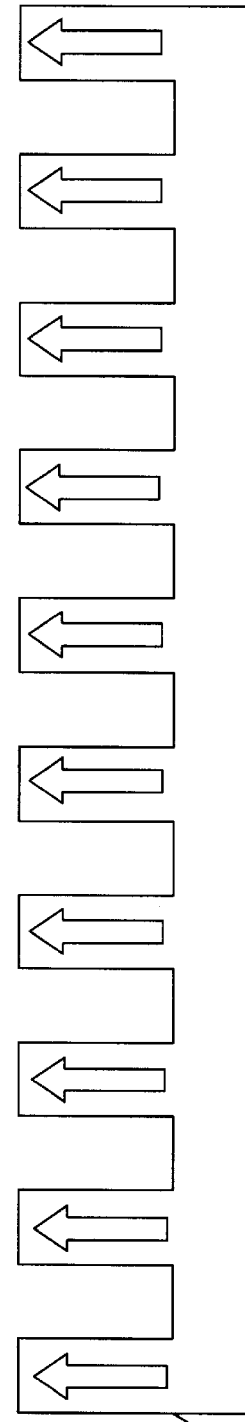
FIG. 2B shows a finned heat sink structure with uniform temperature at the base of the structure.
Figure 3A:
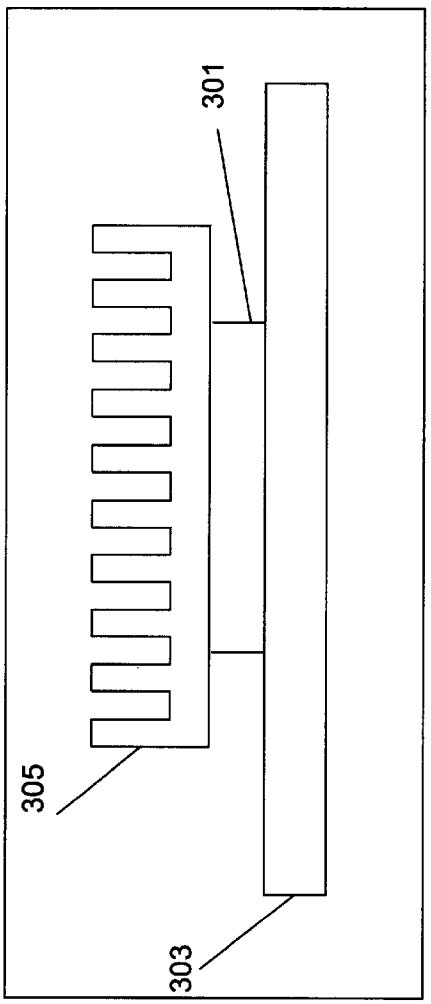
FIG. 3A shows a high power density device on mounting board with heat sink structure placed in contact with a high power density device.
Figure 3B:
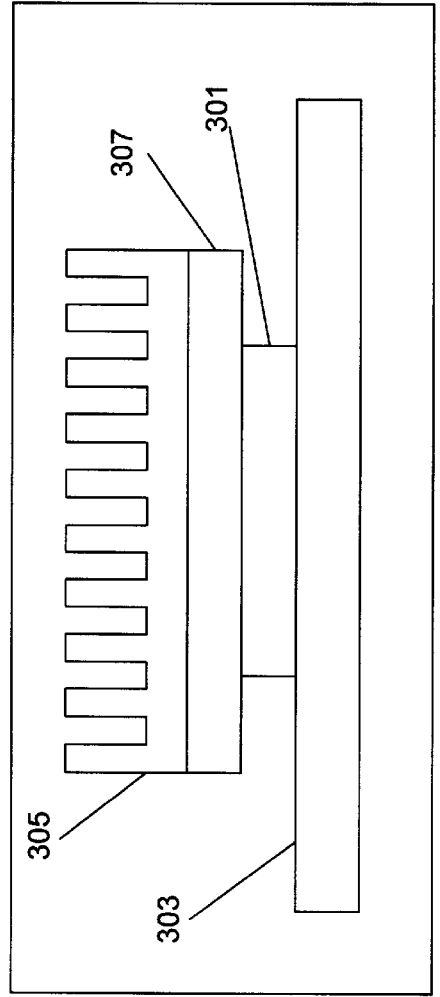
FIG. 3B shows a heat spreader placed between a high power density device and finned heat sink structure.
Figure 4:
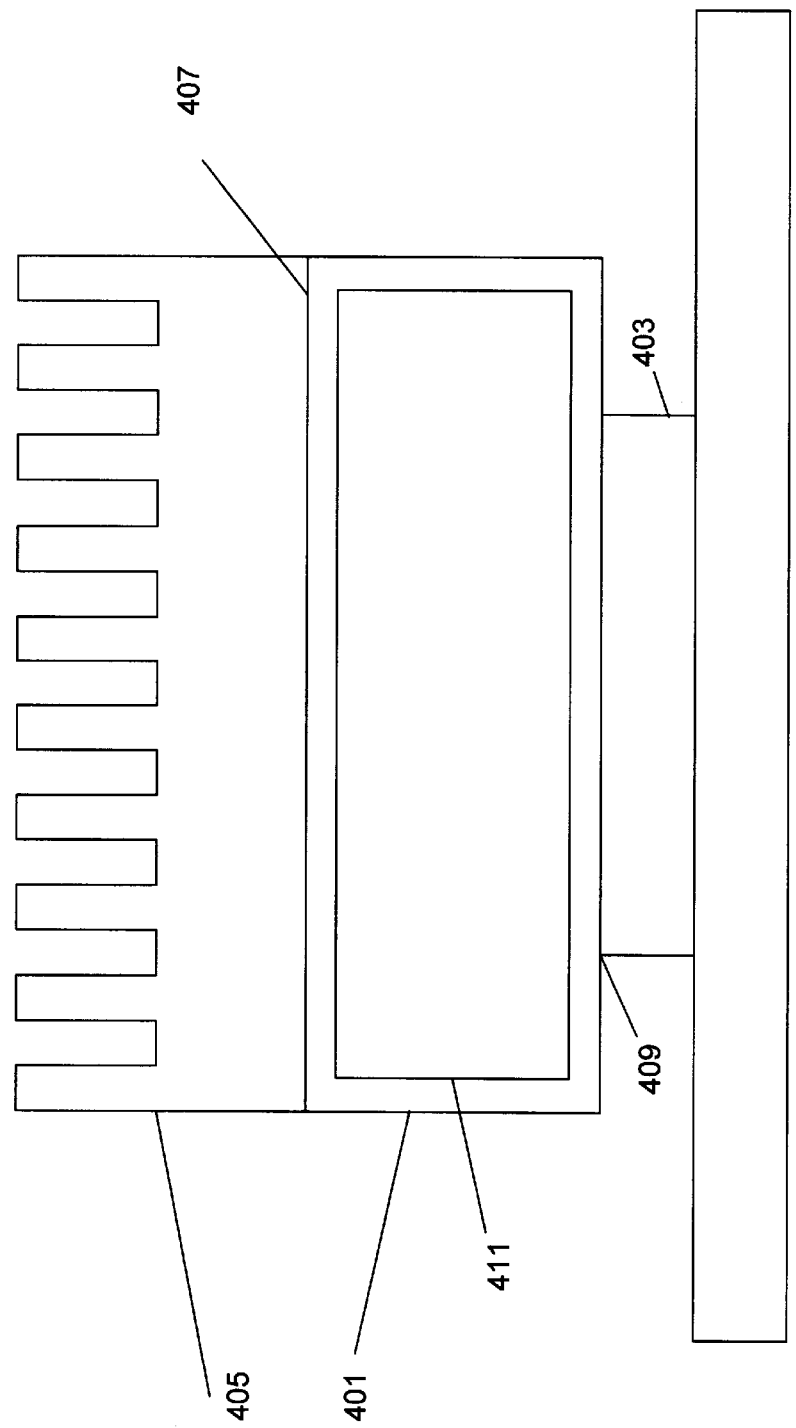
FIG. 4 shows a heat spreader based on a vapor chamber.
Figure 5:
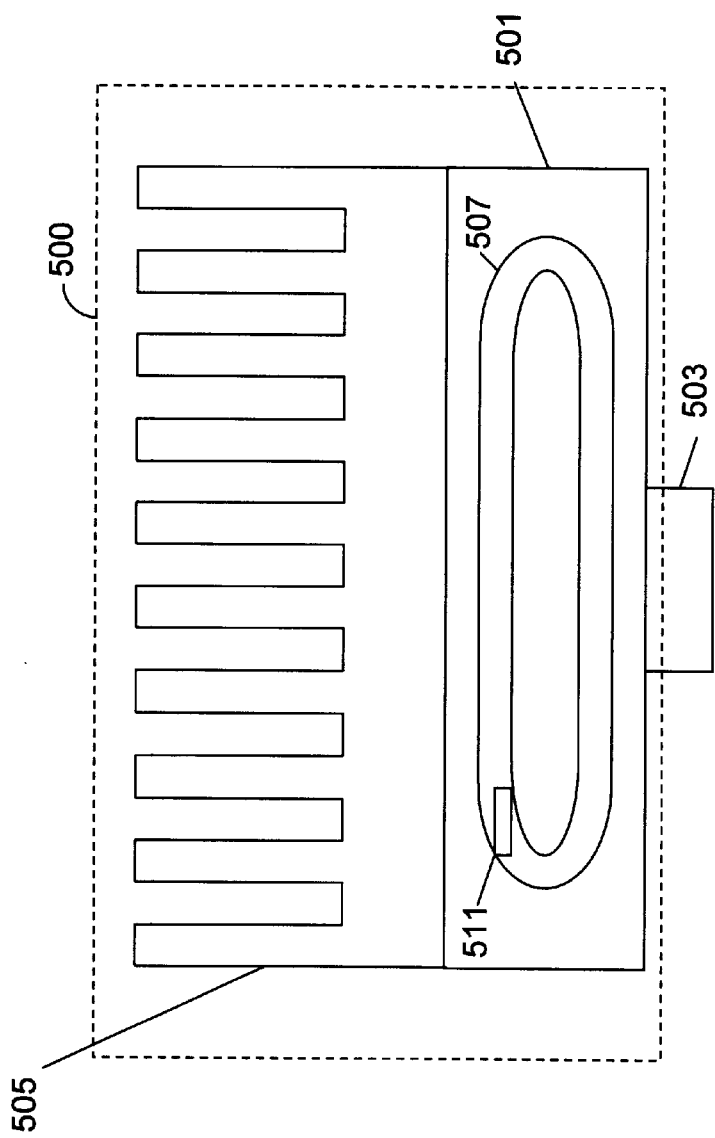
FIG. 5 is a schematic diagram of a system for dissipating heat from high power density devices in accordance with a preferred embodiment of the present invention.

FIG. 5 shows a system 500 for removal of heat from a high power density device. System 500 comprises a heat spreader 501 and a finned heat sink structure 505. System 500 is positioned above a high power density device 503. Heat spreader 501 is constructed using a low thermal resistance material; examples of such material include aluminum or copper. Heat spreader 501 spreads the heat generated by high power density device 503 over its large surface area. Heat is transferred from heat spreader 501 to finned heat sink structure 505 placed in contact with heat spreader 501. Finned heat sink structure 505 is also constructed of a low thermal resistance material. Finned heat sink structure 505 transfers the heat to the atmosphere by natural convection, or by forced convection with the use of a fan.

Heat spreader 501 has a chamber 507 containing liquid metal. One or more electromagnetic pumps 511 are placed inside chamber 507. Electromagnetic pump 511 circulates the liquid metal inside chamber 507. Thus, liquid metal near high power density device 503 absorbs heat, and spreads the heat through heat spreader 501, as the liquid metal flows through heat spreader 501. As liquid metal is a good conductor of heat, the heat is also transferred in this case by conduction. Thus, heat spreader 501 combines the use of conduction and convection thereby allowing an increased flow of heat inside heat spreader 501. The flow of heat inside heat spreader 501 allows for increased temperature uniformity within the heat spreader. This increased temperature uniformity within heat spreader 501 increases transfer of heat between high power density device 503 and finned heat sink 505, thereby allowing efficient use of finned heat sink structure 505. In this manner the system provides a highly effective heat spreader 501 by flowing liquid metal in heat spreader 501 using electromagnetic pump 511.

System 500 is not just limited to finned heat sink structures. It will be apparent to one skilled in the art that any heat sink structure (used for transferring heat to the atmosphere) may be employed in the system without departing from the scope of the invention.

The abovementioned system may be used for dissipating heat from a wide variety of devices. For example high power density device 503 of FIG. 5 may be a micro scale device like microelectronic chip, optoelectronic chip, arrays of hot chips, laser diode, light emitting diode (LED), array of LEDs etc. High power density device 503 may also be a central processing unit of a computer, graphical processor unit or a light bulb. In fact heat spreader 501 may also find its application in biological, chemical, or nuclear reactors to dissipate heat generated by these reactors.

Figure 6:
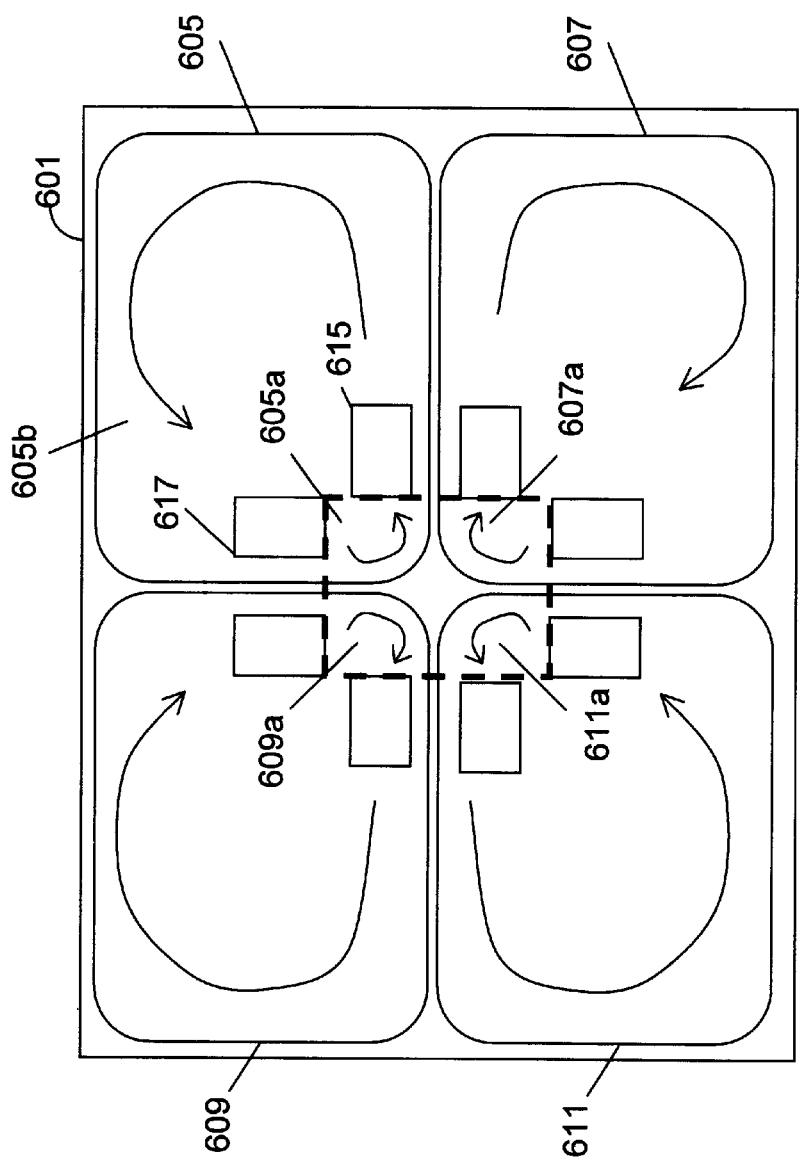
FIG. 6 is a schematic diagram of a heat spreader that uses electromagnetic pumps for circulating liquid metal in accordance with a preferred embodiment of the present invention.

FIG. 6 shows a heat spreader 601 in accordance with the preferred embodiment of the present invention. The cross-section of heat spreader 601 is in the form of a rectangle. Heat spreader 601 is placed over a high power density device (not shown in FIG. 6). Heat spreader 601 has four chambers 605, 607, 609 and 611. The cross-section of each of the chambers is also in the form of a rectangle. Each chamber is filled with liquid metal. Liquid metal in the region directly in contact with the high power density device (comprising of regions 605a, 607a, 609a and 611a) absorbs the generated heat. The working of the heat spreader is illustrated using the example of one of the chambers 605. Chamber 605 has two electromagnetic pumps 615 and 617 for circulating the liquid metal inside chamber 605. The direction of the electric field and the magnetic field in electromagnetic pump 615 is such that electromagnetic pump 615 pushes the hot liquid metal out of hot region 605a. This hot liquid metal circulates in region 605b of chamber 605, thereby spreading the heat. Electromagnetic pump 617 pushes the liquid metal from region 605b back into hot region 605a. The hot liquid metal is thus circulated in chamber 605 in form of a closed loop spreading the heat uniformly throughout chamber 605. The liquid metal develops a steady state mean fluid velocity, as the force exerted by the electromagnetic pump is balanced by viscous drag. In a similar manner liquid metal is circulated in each of the chambers 607, 609 and 611. The heat spreader thus provides a mechanism to uniformly distribute heat leading to effective removal of heat from the high power density device.

Figure 7:
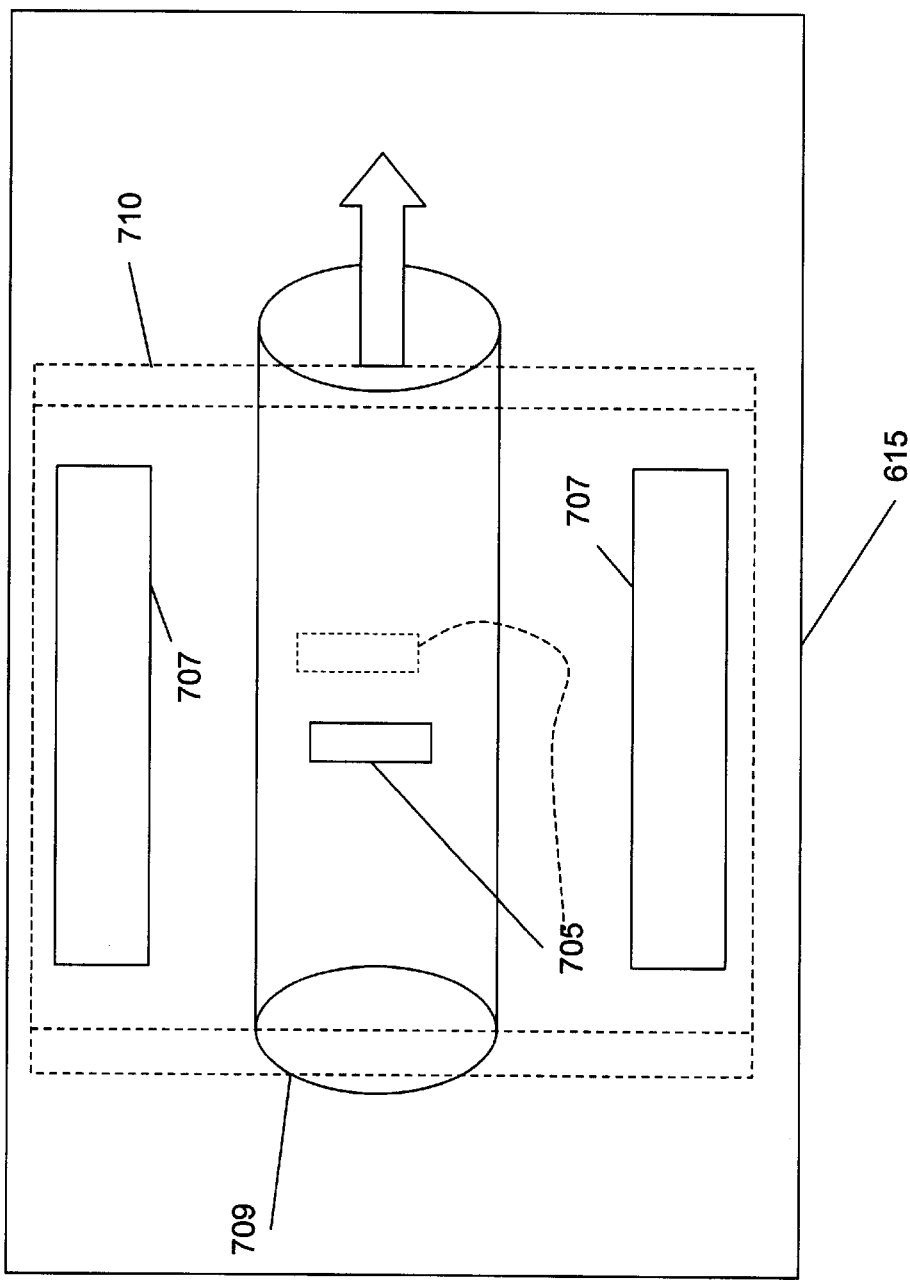
FIG. 7 shows the principle of an electromagnetic pump provided by the heat spreader of the abovementioned system for circulating liquid metal inside the heat spreader.

FIG. 7 shows the principle of electromagnetic pumps employed in the heat spreader for circulating liquid metal. Electromagnetic pump 615 comprises of a pair of electrode plates 705 placed vertically facing each other. A DC (direct current) voltage is applied across the electrode plates. The DC voltage produces an electric field across electrode plates 705. Permanent magnets 707 are arranged facing each other above and below the plane containing electrode plates 705. A tube 709 carries liquid metal. The direction of magnetic field generated by the permanent magnets 707 is perpendicular to the direction of electric field provided by the electrode plates 705. An electromagnetic force acts on the liquid metal causing it to flow in a direction perpendicular to the plane of electric and magnetic fields (as shown by the block arrow in Figure). It would be evident to one skilled in the art that the method of pumping can be implemented in several different ways based on the abovementioned principle. For example, DC electromagnetic pumps (as described above) can be utilized in applications where DC sources are available while induction electromagnetic pumps utilizing polyphase induction coils can be used in cases where physical contact to the liquid metal is undesirable (say, where the liquid metal is corrosive).

In certain applications, the heat spreader may need to be provided with electromagnetic interference (EMI) shielding to shield the high power density device from electromagnetic radiations generated by the pump. These electromagnetic radiations, if not shielded, might adversely affect the performance of the high power density device or its components. Accordingly, either the heat spreader or the high power density device is enclosed within a housing that shields the high power density device. This EMI shielding may be provided using standard methods such as magnetic shields and EMI shielding tapes. As shown in FIG. 7, magnetic shield 710 confines the magnetic field within the pump. The magnetic shield 710 may be made using high magnetic permeability materials such as steel, nickel, alnico, or permandur or other specially processed materials.

In the preferred embodiment, tube 709 is constructed of polymer materials such as Teflon or polyurethane. Teflon has the advantage that it can be easily machined. Alternatively, refractory metals such as tungsten or molybdenum may also be used as the material of construction of tube 709. Ultrathin anodized aluminum or nickel-coated aluminum or copper can also be used.

In the preferred embodiment, the liquid metal carried by tube 709 is an alloy of gallium and indium. Preferred compositions comprise 65 to 75% by mass gallium and 20 to 25% indium. Materials such as tin, copper, zinc and bismuth may also be present in small percentages. One such preferred composition comprises 66% gallium, 20% indium, 11% tin, 1% copper, 1% zinc and 1% bismuth. Some examples of the commercially available GaIn alloys include galistan—a concoction popular as a substitute for mercury (Hg) in medical applications, and newmerc. The various properties of Ga—In alloy make it desirable liquid metal for use in heat spreaders. The Ga—In alloy spans a wide range of temperature with high thermal and electrical conductivities. It has melting points ranging from −15° C. to 30° C. and does not form vapor at least up to 2000° C. It is not toxic and is relatively cheap. It easily forms alloys with aluminum and copper. It is inert to polyimides, polycarbonates, glass, alumina, Teflon, and conducting metals such as tungsten, molybdenum, and nickel (thereby making these materials suitable for construction of tubes).

However, it is apparent to one skilled in the art that a number of other liquid metals may be used without departing from the scope of the invention. For example, liquid metals having high thermal conductivity, high electrical conductivity and high volumetric heat capacity can also be used. Some examples of liquid metals that can be used in an embodiment of the invention include mercury, gallium, sodium potassium eutectic alloy (78% sodium, 22% potassium by mass), bismuth tin alloy (58% bismuth, 42% tin by mass), bismuth lead alloy (55% bismuth, 45% lead) etc. Bismuth based alloys are generally used at high temperatures (40 to 140° C.). Pure indium can be used at temperatures above 156° C. (i.e., the melting point of indium).

Figure 8:
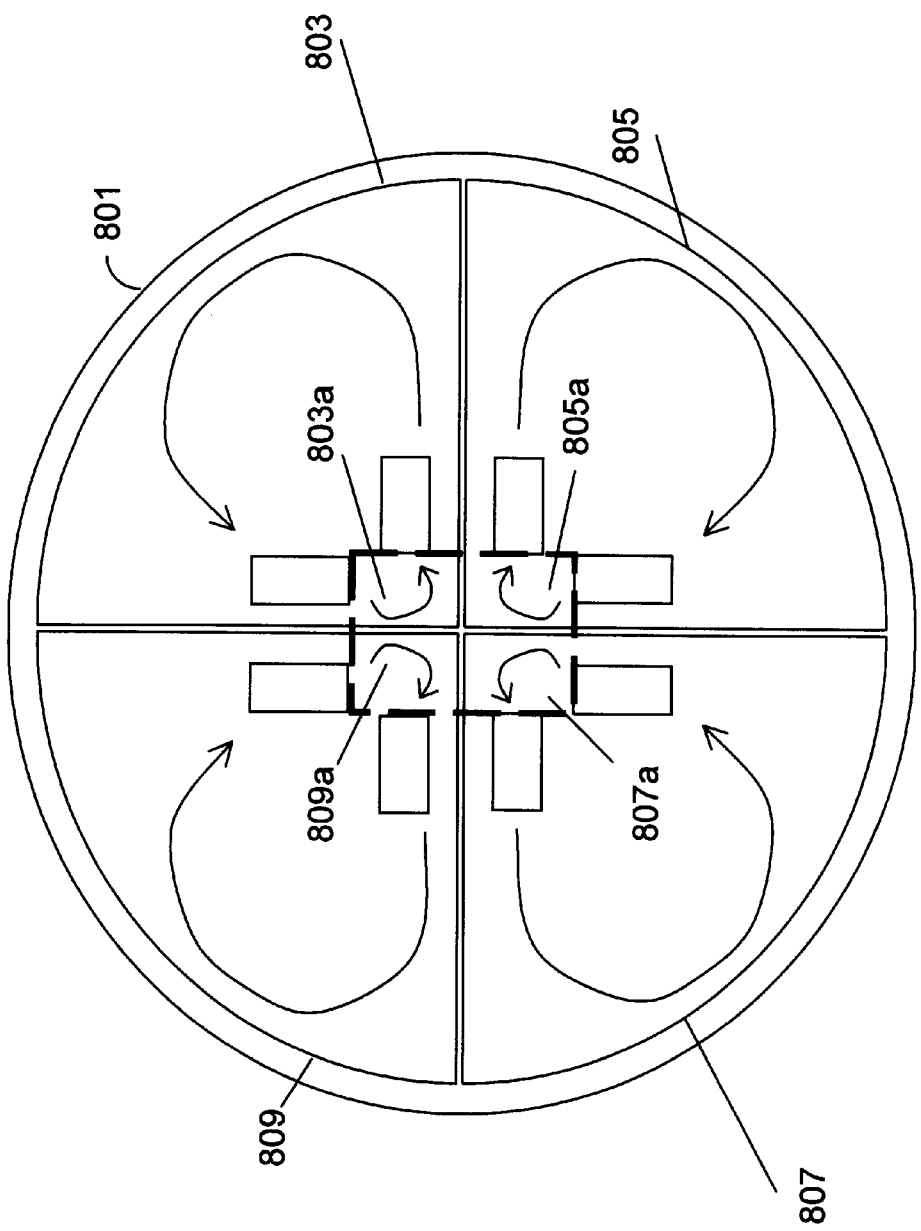
FIG. 8 shows a heat spreader with a circular cross section in accordance with an alternate embodiment of the present invention.
Figure 9:
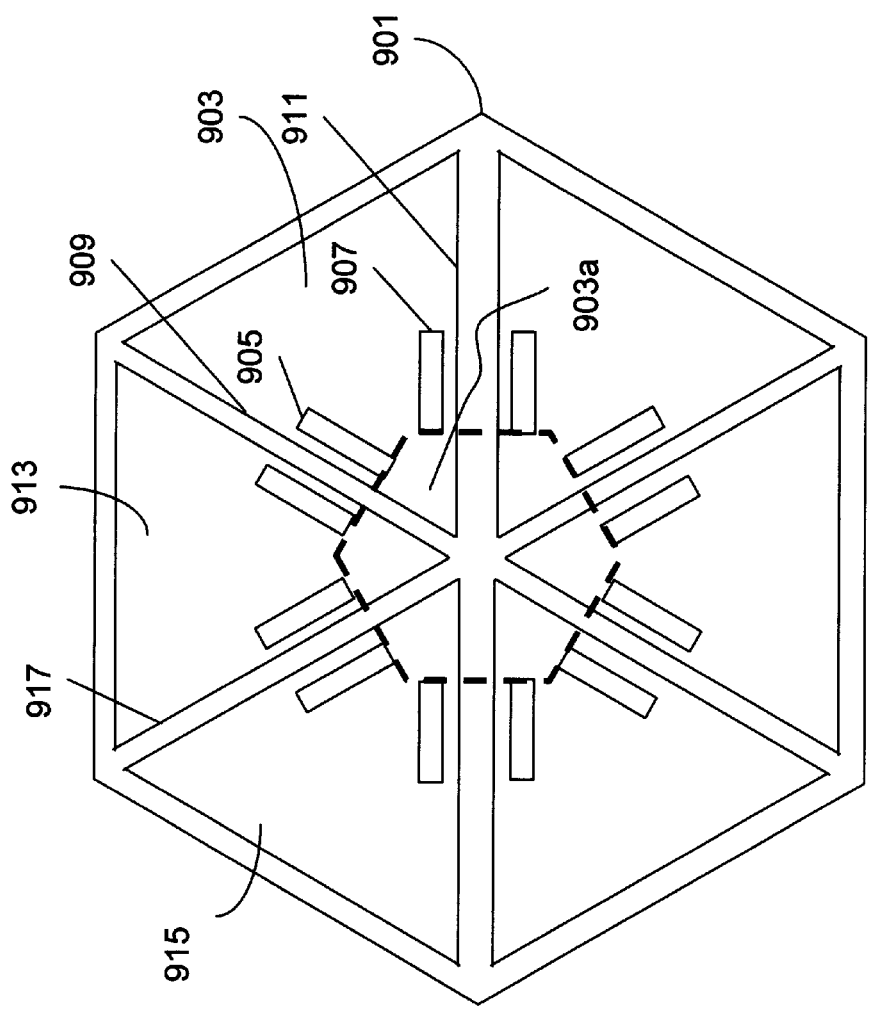
FIG. 9 shows a heat spreader with a hexagonal cross section in accordance with another alternate embodiment of the present invention.

There is a great deal of flexibility inherent in the design of heat spreaders provided by the invention. For example, the cross section of the heat spreader need not be a square. A variety of cross-sections of the heat spreader are possible depending on the requirements. FIG. 8 shows a heat spreader 801 that has a circular cross section. Heat spreader 801 is divided into four chambers 803, 805, 807 and 809. The chambers are in the form of quadrants of a circle. The electromagnetic pumps are configured in a similar manner as shown in FIG. 6. The hot liquid from region 803a is pushed outside and circulated in form of a closed loop spreading the heat uniformly throughout chamber 803. FIG. 9 shows another heat spreader 901 that has a hexagonal cross-section. The chambers are in the form of triangles, each chamber subtending an angle of 60° at the center. Chamber 903 has two electromagnetic pumps 905 and 907 located parallel to two sides 909 and 911 of chamber 903. The electromagnetic pumps circulate liquid metal in chamber 903. In a similar manner, liquid metal in each of the chambers is circulated distributing the heat uniformly throughout heat spreader 903. It is not necessary to have two pumps per chamber in order to circulate liquid metal in the chamber. For example, only one pump (aligned along side 909) may be provided for pushing liquid metal out of hot regions 903a and 913a from chambers 903 and chamber 913 respectively. This is because the direction of force to be applied on liquid metal remains the same in both the chambers. Similarly, a single pump (aligned along side 917) may be provided for collecting the circulated liquid in chambers 913 and 915. Thus, the number of electromagnetic pumps provided in a given heat spreader may vary depending on the specifications of the heat spreader or the electromagnetic pump.

A number of different sizes of heat spreaders may also be provided depending on the size of high power density device. In case the high power density device is a microelectronic chip or an array of chips, the heat spreader may be small (say, having dimensions of the order of millimeters). In case the high power density device is a chemical/nuclear reactor a bigger heat spreader may be provided.

Figure 10:
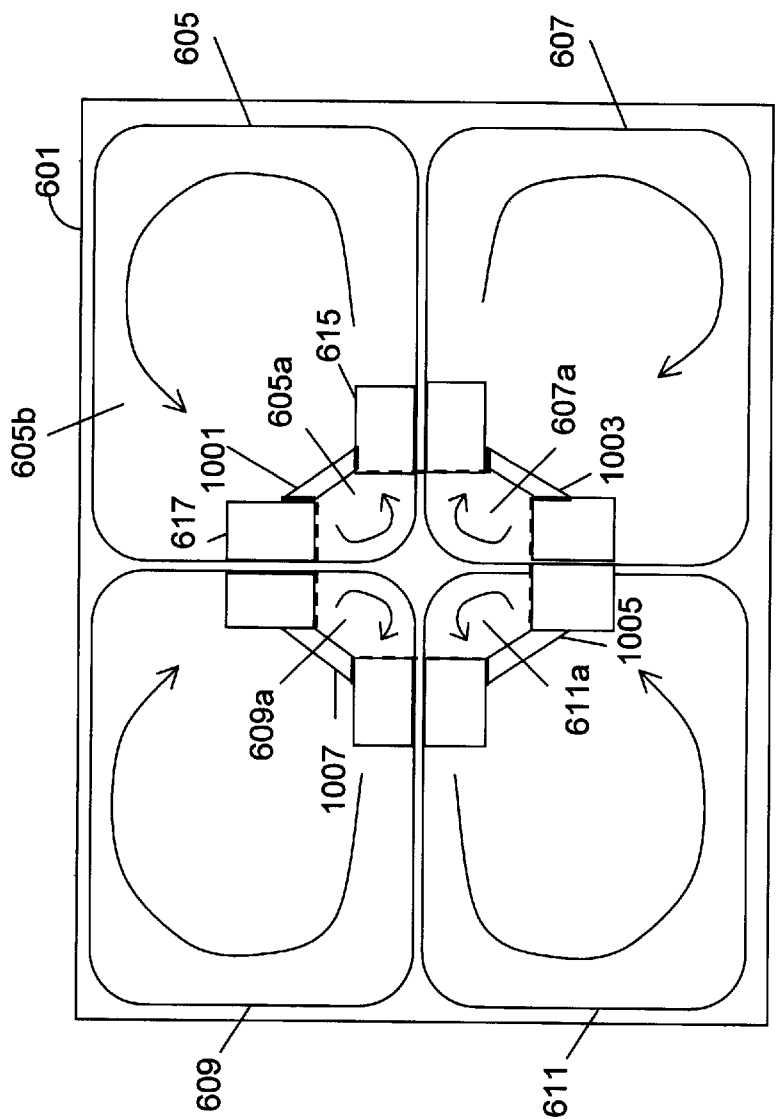
FIG. 10 shows a heat spreader that has thermoelectric generators for powering electromagnetic pumps in accordance with another alternate embodiment of the present invention.

FIG. 10 shows an alternate embodiment of the invention. In this embodiment, heat spreader 601 is provided with four thermoelectric generators 1001, 1003, 1005 and 1007. Thermoelectric generator 1001 is positioned such that one end of thermoelectric generator 1001 is in contact with liquid metal in region 605a while the other end is in contact with relatively cooler liquid metal in region 605b. Thus, there exists a temperature difference between the two ends of the thermoelectric generator 1001. Thermoelectric generator 1001 utilizes this temperature difference to generate power. This power is then utilized for operating electromagnetic pumps 615 and 617.

Thermoelectric generator 1001 is comprised of series of p type semiconductor members and n type semiconductor members sandwiched between thermally-conducting, electrically-insulating substrates such as oxide-coated silicon wafers, aluminum nitride (AlN) and other thin ceramic wafers. Thermoelectric generator 1001 utilizes the "Seebeck effect" to convert the temperature difference between the hot region 605a and the cold region 605b of heat spreader 601 to electrical energy in the form of a potential difference. The voltage generated by thermoelectric generator 1001 depends on a temperature difference between the regions 605a and 605b. Alloys of bismuth (Bi), tellurium (Te), antimony (Sb) and selenium (Se) are the most commonly used materials for manufacturing the semiconductor members of thermoelectric generator 1001 for devices operating near room temperature.

The use of thermoelectric generators in heat spreader provides sufficient power to drive the electromagnetic pumps. This may be illustrated using the following representative example:

The coefficient of performance of a thermoelectric generator i.e. the ratio of electrical power to the heat flow into the hot end, is roughly:

$$\eta = \epsilon (\Delta T / T_h)$$

where $\epsilon$ is the thermodynamic conversion efficiency, $\Delta T$ is the temperature differential between the hot and cold ends, and $T_h$ is the temperature of the hot end. The value of $\epsilon$ is 0.1 for conventional Bi/Sb/Te/Se alloys and Pb/Te/Se alloy materials. The typical temperature differential across the two ends of thermoelectric generator would be around 15–40 K (i.e., 15–40 Kelvin). Assuming $\Delta T = 30$ K and $T_h = 358$ K (i.e., 85° C.), the coefficient of performance $\eta$ of the thermoelectric generator comes out to be 0.0084. If the high power density device dissipates 100 W, the electrical power generated by the thermoelectric generator will be 0.84 W, which is sufficient for driving the electromagnetic pump. Of course, better thermoelectric generators can easily double the performance.

The use of liquid metal circulation in heat spreaders offers many advantages over conventional heat spreaders. First, the circulation of liquid metal in heat spreader takes advantage of both conduction and convection as liquid metal is a good conductor of heat. This is unlike heat spreaders made of copper or aluminum that spread heat by conduction only. Use of circulating liquid metal has an advantage over circulating water as water, being a poor conductor of heat, can spread heat by convection only. Second, in heat spreaders using liquid metals, maximum heat transfer is not limited by vapor/liquid nucleation properties unlike heat spreaders based on vapor chambers. Also, interface resistance between liquid metal and heat spreader surface is comparatively low in liquid metal-based heat spreaders. Third, liquid metals can be pumped by electromagnetic pump that has no moving mechanical parts. Electromagnetic pumps are reliable, have no noise or vibration and occupy very small volume. Fourth, thermoelectric generators may be employed to power the electromagnetic pumps thereby providing heat spreaders that do not require any external sources, to power the electromagnetic pumps.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A heat spreader for spreading heat generated by high power density devices, the heat spreader comprising:
    a. at least one cooling chamber containing liquid metal;
    b. electromagnetic pump means for circulating the liquid metal in the at least one cooling chamber, the liquid metal circulating in the at least one cooling chamber, the circulation spreading the heat generated by high power density devices over the heat spreader.

2. The heat spreader as claimed in claim 1 wherein the liquid metal in the cooling chambers is an alloy of gallium and indium.

3. The heat spreader as claimed in claim 1 wherein the liquid metal in the cooling chambers is selected from a group consisting of indium, gallium, mercury bismuth tin alloy, bismuth lead alloy and sodium potassium eutectic alloy.

4. The heat spreader as claimed in claim 1 wherein the heat spreader has four cooling chambers.

5. The heat spreader as claimed in claim 1 wherein the means for circulating the liquid metal is an arrangement of a plurality of electromagnetic pumps.

6. A system for spreading heat generated by high power density devices, the system comprising:
    a. a heat spreader positioned adjacent to the high power density device, the heat spreader comprising:
        I. a plurality of cooling chambers containing liquid metal;
        II. a plurality of electromagnetic pumps arranged in a configuration so as to circulate the liquid metal in the cooling chambers;
    b. A heat sink coupled to the heat spreader for dissipating heat to the atmosphere.

7. The system as claimed in claim 6 wherein the system further comprises an electromagnetic interference shield.

8. The system as claimed in claim 6 wherein the system further comprises a thermoelectric generator for generating power for running the electromagnetic pumps, the thermoelectric generator utilizing the temperature difference between its ends to generate power.

9. The system as claimed in claim 6 wherein the cross-section of heat spreader is selected from a group consisting of circular, rectangular and hexagonal.

10. The system as claimed in claim 6 wherein the heat spreader has four cooling chambers.

11. The system as claimed in claim 10 wherein the heat spreader has eight electromagnetic pumps placed symmetrically around the center of the heat spreader.

12. A system for spreading heat generated by high power density devices, the system comprising:
   a. a heat spreader positioned adjacent to the high power density device, the heat spreader comprising:
      I. at least one cooling chamber containing liquid metal;
      II. at least one electromagnetic pump arranged so as to circulate the liquid metal in the at least one cooling chamber;
      III. a thermoelectric generator for generating power for running the electromagnetic pump, the thermoelectric generator utilizing the temperature difference between its ends to generate power;
   b. A heat sink coupled to the heat spreader for dissipating heat to the atmosphere.

13. The system as claimed in claim 12 wherein the cross-section of heat spreader is selected from a group consisting of circular, rectangular and hexagonal.

14. The system as claimed in claim 12 wherein the heat spreader has four cooling chambers.

15. The system as claimed in claim 12 wherein the heat spreader has eight electromagnetic pumps placed symmetrically around the center of the heat spreader.

* * * * *